United States Patent [19]

Yajima et al.

[11] Patent Number: 5,670,745
[45] Date of Patent: Sep. 23, 1997

[54] HERMETICALLY SEALED CASE SEALED BY PACKING

[75] Inventors: Hideo Yajima; Toshikazu Ogino, both of Atsugi, Japan

[73] Assignee: Mitsumi Electric Co., Ltd., Tokyo, Japan

[21] Appl. No.: 363,715

[22] Filed: Dec. 23, 1994

[30] Foreign Application Priority Data

Dec. 27, 1993 [JP] Japan .................. 5-070194 U
Dec. 28, 1993 [JP] Japan .................. 5-070719 U

[51] Int. Cl.⁶ .................................................. H05K 5/06
[52] U.S. Cl. .................. 174/65 R; 220/3.8; 220/327; 220/378
[58] Field of Search ................. 174/50, 50.5, 52.1, 174/52.3, 60, 65 R; 220/3.8, 327, 378

[56] References Cited

U.S. PATENT DOCUMENTS

| | | | |
|---|---|---|---|
| 4,307,264 | 12/1981 | Hess | 174/52 |
| 4,627,646 | 12/1986 | Kessel | 285/114 |
| 5,531,345 | 7/1996 | Nakamura et al. | 220/3.8 |

FOREIGN PATENT DOCUMENTS

| | | | |
|---|---|---|---|
| 61-158707 | 10/1986 | Japan | H01Q 1/32 |
| 61-274402 | 12/1986 | Japan | H01Q 1/22 |
| 2-35803 | 2/1990 | Japan | H01Q 1/32 |
| 3-238903 | 10/1991 | Japan | H01Q 1/36 |
| 4-76703 | 7/1992 | Japan | H01P 5/10 |
| 954235 | 2/1961 | United Kingdom | 174/65 |

*Primary Examiner*—Kristine L. Kincaid
*Assistant Examiner*—Joseph Waks
*Attorney, Agent, or Firm*—Michael N. Meller

[57] ABSTRACT

A hermetically sealed case, has a space between a top case and a bottom case which can be completely sealed by means of a waterproof packing, and in which an area around a connecting cable is completely sealed. A first case having an annular projection formed at the periphery thereof is assembled to a second case having an annular groove having a shape corresponding to that of the projection of the first case formed at the periphery of the second case. An elastic member is provided between the projection of said first case and the groove of said second case. The width of said projection is smaller than the width of said groove, and said projection is fitted within said groove in a transverse direction. The elastic member deflects toward the groove, that is, deflects such that the ends of the elastic member are drawn toward the projection. Line contact is established between the corners of the projection and the elastic member, and also between the corners of the groove and the elastic member. A through hole through which the connecting cable is led is provided in one of the cases. The elastic member is pressed by a press-fitting member, and is press-fit between the through hole and the connecting cable. Sealing of the pair of cases and sealing of the area around the connecting cable performed independently of each other.

10 Claims, 12 Drawing Sheets

HERMETICALLY SEALED CASE SEALED BY PACKING

BACKGROUND OF THE INVENTION

1. Field of the Invention

The present invention generally relates to hermetically sealed cases, and more particularly to a hermetically sealed case which accommodates an electrical device, wherein connecting cables come out from the electrical device.

Recently, GPS (global positioning system) for automobiles have become widely used. In GPS, small and flat antenna elements that require relatively small space for installment and are characterized by small variation in antenna property are used.

Antennas used in GPS are mounted on an outer body of an automobile by means of a magnet or the like. Since the antennas are exposed to the weather, they are accommodated in waterproof cases.

2. Description of the Prior Art

FIG. 1 is a cross sectional view of the construction of a conventional GPS antenna apparatus.

Referring to FIG. 1, an antenna apparatus is constructed such that an antenna unit 71 is accommodated in a hermetically sealed case 70 that protects the antenna unit 71 from the weather.

The antenna unit 71 comprises a flat antenna element 72, a metal mounting plate 73 and a shield case 74. The flat antenna element 72 receives radio waves from a GPS satellite. The shield case 74 accommodates a front end substrate in which a low-noise amplifier for amplifying radio waves received by the flat antenna element 72 is provided.

The antenna unit 71 is disposed on a bottom cover 75 formed of a resin. An annular waterproof packing 76 is disposed at the peripheral area of the bottom cover 75. The bottom cover 75 is covered by a top cover 77 formed of a resin. The bottom cover 75 and the bottom cover 77 are secured to each other by screws (not shown). Thus, the waterproof packing 76 between the bottom cover 75 and the top cover 77 seals the space between the covers.

As shown in the FIG. 1, the packing 76 has a rectangular cross section, the top and bottom surfaces thereof being level. The surface of the bottom cover 75, which surface is in contact with the waterproof packing 76, is level. The surface of the top cover 77, which surface is in contact with the waterproof packing 76, is also level.

An assembly composed of the bottom cover 75 and the top cover 77 is accommodated in a bottom exterior case 78 and covered by a top exterior case 79.

A permanent magnet (not shown) is provided at the bottom of the hermetically sealed case 70 having the above construction. For example, the magnet fixes the case 70 to a hood of an automobile. Thus, the packing 76 prevents rainwater or the like from entering the space between the covers so that water tightness around the antenna unit 71 is maintained.

As has been described above, the conventional hermetically sealed case is configured such that the waterproof packing 76 seals the space between the bottom cover 75 and the top cover 77 by establishing surface contact with the bottom cover 75 and with the top cover 77. This means that, if the surfaces of the waterproof packing 76 are not satisfactorily flat, or if the surfaces of the bottom cover 75 and the top cover 77, which surfaces (hereinafter, referred to as sealing surfaces) come into contact with the waterproof packing 76 are not satisfactorily flat, incomplete sealing results. Rainwater or the like may enter the interior and causes failure of the antenna unit 71 accommodated in the space between the covers. Since the bottom cover 75 and the top cover 77 are generally formed by resin molding or metal molding (aluminum die cast etc.), it is difficult to ensure that the entire sealing surfaces be flat.

As shown in FIGS. 2A and 2B, in the conventional antenna described above, a connecting cable 80 connecting the antenna unit 71 and the GPS system comes out from a notch 75a formed in the bottom cover 75. The neighborhood of the cable 80 is sealed by providing a waterproof pad 81 configured to fit the outline of the notch 75a around the cable 80. The space between the top cover 77 and the bottom cover 75 adjacent the notch 75 is sealed by allowing the waterproof packing 76 to be in contact with the waterproof pad 81.

However, as shown in FIG. 2B, in the conventional hermetically sealed case 70 described above, the waterproof packing 76, the waterproof pad 81 and the bottom case 75 come into contact with each other at two points A. There is a problem in that, because of dimensional tolerance of these three members, contact between the three members may not be established properly, and water tightness cannot take place in the points A.

SUMMARY OF THE INVENTION

Accordingly, a general object of the present invention is to provide a novel and useful hermetically sealed case in which the aforementioned problem is eliminated.

A more specific object of the present invention is to provide a hermetically sealed case in which a space between top and bottom covers is completely sealed using a waterproof packing.

Another and more specific object of the present invention is to provide a hermetically sealed case having a portion, through which a cable going out from a device inside is led, and is completely sealed.

In order to achieve the aforementioned objects, the present invention provides a hermetically sealed case for accommodating a device requiring water tightness, the hermetically sealed case comprising: a first case having an annular projection formed at the periphery thereof; a second case having an annular groove having a shape corresponding to that of the projection of the first case formed at the periphery of the second case; and an elastic member mounted between the projection of the first case and the groove of the second case, wherein the width of a projection is smaller than the width of the groove, and the projection is fitted within the groove in a transverse direction. According to this aspect of the present invention, the elastic member deflects toward the groove, that is, deflects such that the ends of the elastic member are drawn toward the projection. The elastic member establishes line contact with the corner of the projection and with the corners of the groove. Accordingly, excellent sealing quality is achieved without requiring a high degree of flatness of the surfaces of the elastic member and the cases, which surfaces are involved in sealing.

The aforementioned objects of the present invention can also be achieved by a hermetically sealed case for accommodating a device having a connecting cable connected to an outside device, in an accommodating space formed by engaging a pair of cases with each other via an elastic member, the hermetically sealed case comprising: a through hole formed in one of the pair of cases, through which through hole the connecting cable from the device accommodated in the accommodating space is led; an elastic member which, provided adjacent the through hole in the accommodating space, has a hole through which the connecting cable is led, and which is press-fit between the through hole and the connecting cable so as to seal a gap between the through hole and the connecting cable; and press-fitting means for press-fitting the elastic member in a gap between the through hole and the connecting cable. According to this aspect of the present invention, an elastic member seals a gap between a connecting cable and a through hole by being pressed by a press-fitting member, resulting in reliable sealing. Sealing around the connecting cable and sealing of a pair of cases are done separately and thus reliably. Hence, it is ensured that water tightness is maintained.

BRIEF DESCRIPTION OF THE DRAWINGS

Other objects and further features of the present invention will be apparent from the following detailed description when read in conjunction with the accompanying drawings, in which.

DETAILED DESCRIPTION

Figure 3:
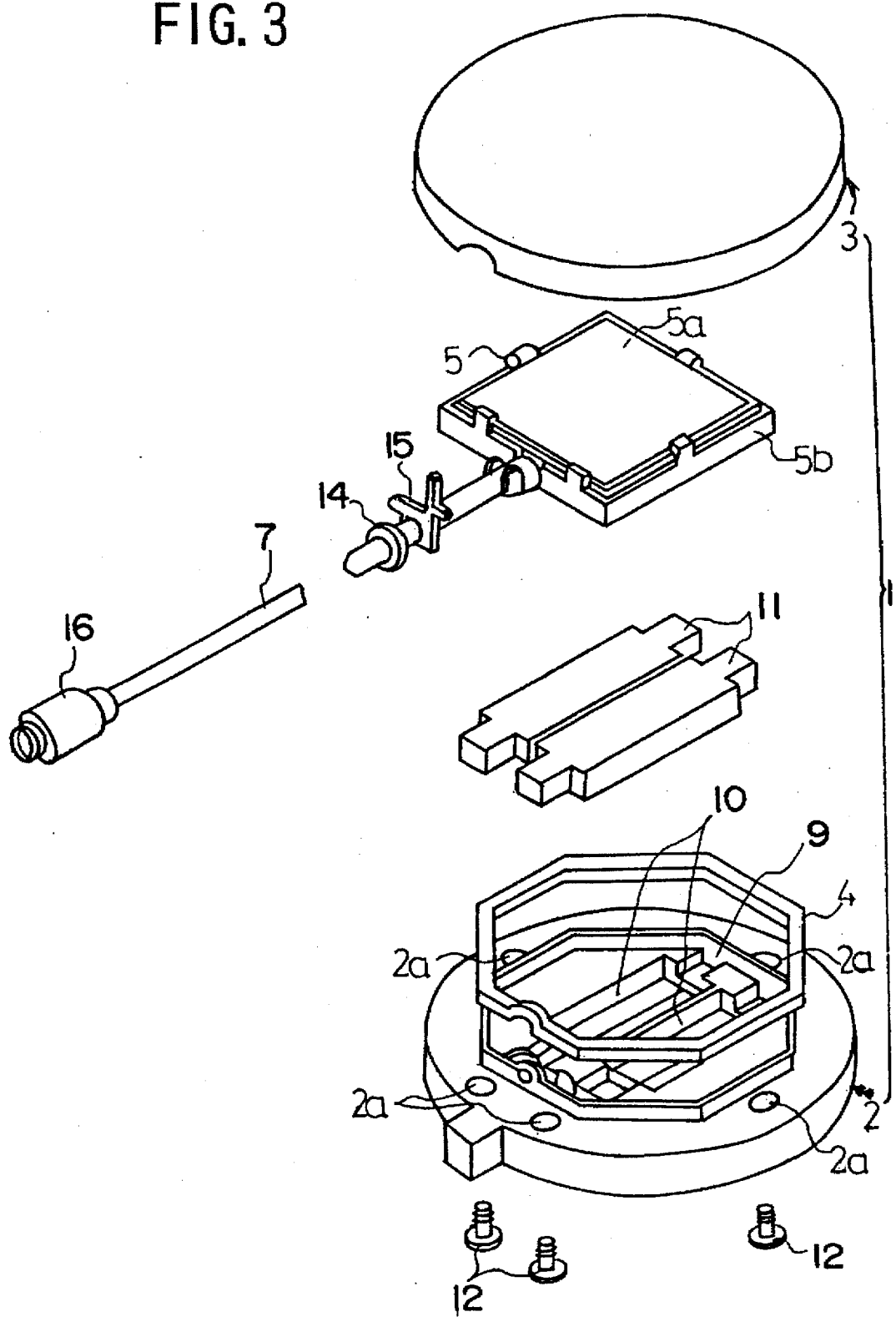
FIG. 3 is an exploded perspective view of a GPS antenna apparatus to which the present invention is applied.

FIG. 3 is an exploded perspective view of a GPS antenna apparatus to which an embodiment of a hermetically sealed case of the present invention is applied. A hermetically sealed case 1 of this embodiment comprises a bottom case 2 and a top case 3. A GPS antenna unit 5 is accommodated in the space between the bottom case 2 and the top case 3.

The GPS antenna unit 5 has a flat antenna 5a for converting radio waves from a satellite into electrical signals, and a circuit substrate (not shown) on which circuits for amplifying electrical signals are mounted. The flat antenna 5a and the circuit substrate are held to be integral with each other by a shield portion 5b. A connecting cable 7 for supplying received signals to the outside comes out from the antenna unit 5.

The bottom case 2 and the top case 3 are engaged with each other via a waterproof packing 4 formed of an elastic material such as a rubber and are assembled into the hermetically sealed case 1 by screws 12. The screw 12 are settled in the top case 3 via holes 2a provided at the periphery the bottom case 2. An accommodating space 9 is formed inside the hermetically sealed case 1. A magnet accommodating part 10 for accommodating a magnet 11 is provided at the bottom of the accommodating space 9. The magnet 11 is disposed at the bottom of the bottom case 2 so that the hermetically sealed case 1 can be fixed to any member formed of a magnetic material.

Figure 4:
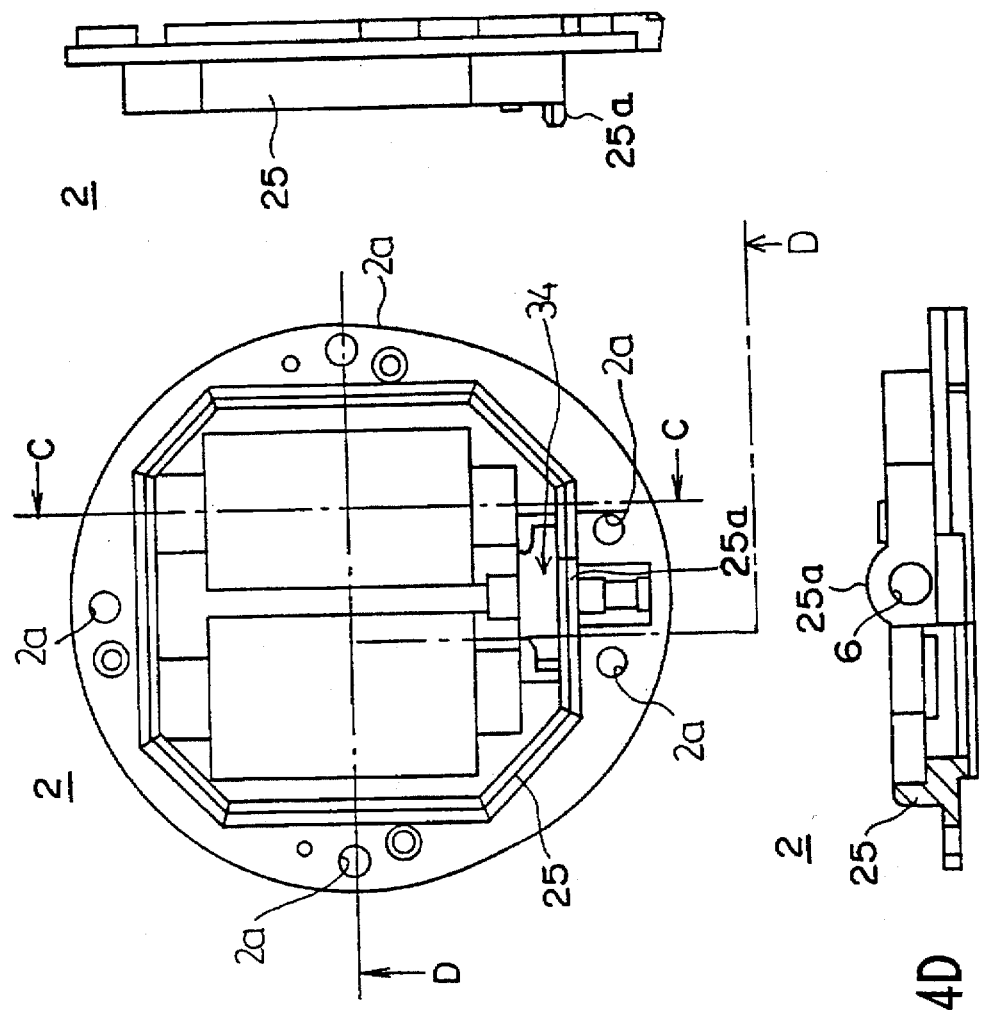
FIG. 4A is a top view of a top case shown in FIG. 3.
FIG. 4B is a side view of the top case.
FIG. 4C is a cross sectional view taken along the line C—C of FIG. 4A.
FIG. 4D is a fragmentary cross sectional view taken along the line D—D of FIG. 4A.

FIG. 4A is a top view of the bottom case 2, FIG. 4B is a side view showing the bottom case 2, FIG. 4C is a cross sectional view taken along the line C—C of FIG. 4A, and FIG. 4D is a fragmentary cross sectional view taken along the line D—D of FIG. 4A.

The bottom case 2 is formed of a resin and, as shown in FIG. 4A through 4c, has a projection 25. Viewed from top, the projection 25 has the shape of an octagonal annular body. The top of the projection 25 is tapered off to have a triangular cross section. The projection 25 has a width of $d_1$ (see FIG. 4C). An arch part 25a is formed in the projection 25, and a through hole 6 through which a cable is led from inside the case is formed in the arch part 25a.

Figure 1:
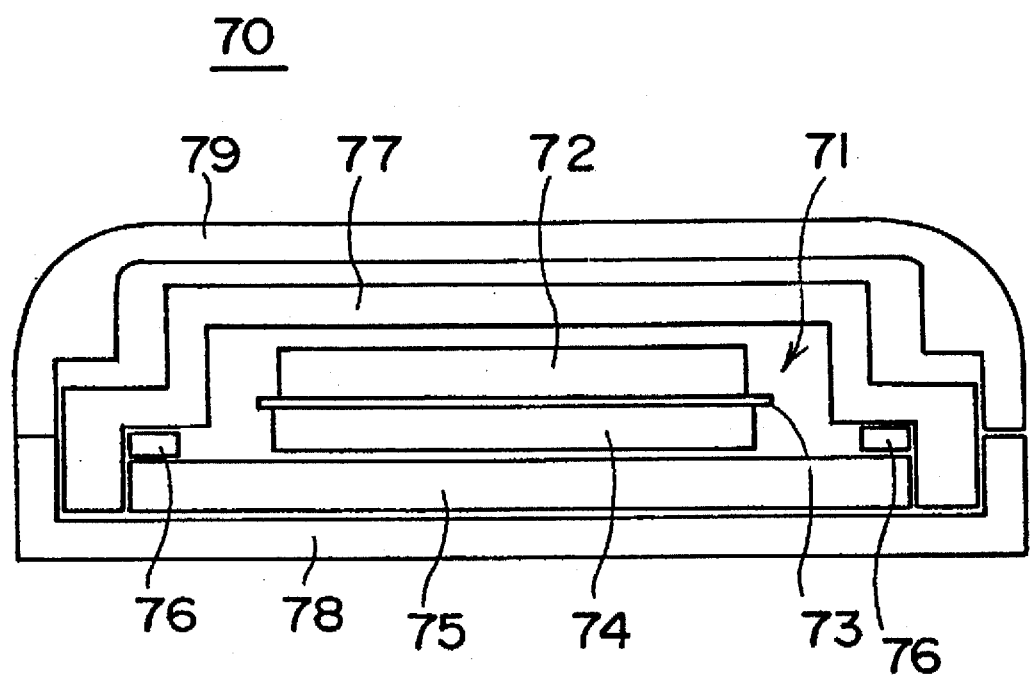
FIG. 1 is a cross sectional view of a GPS antenna apparatus having a conventional hermetically sealed case.
Figure 2A:
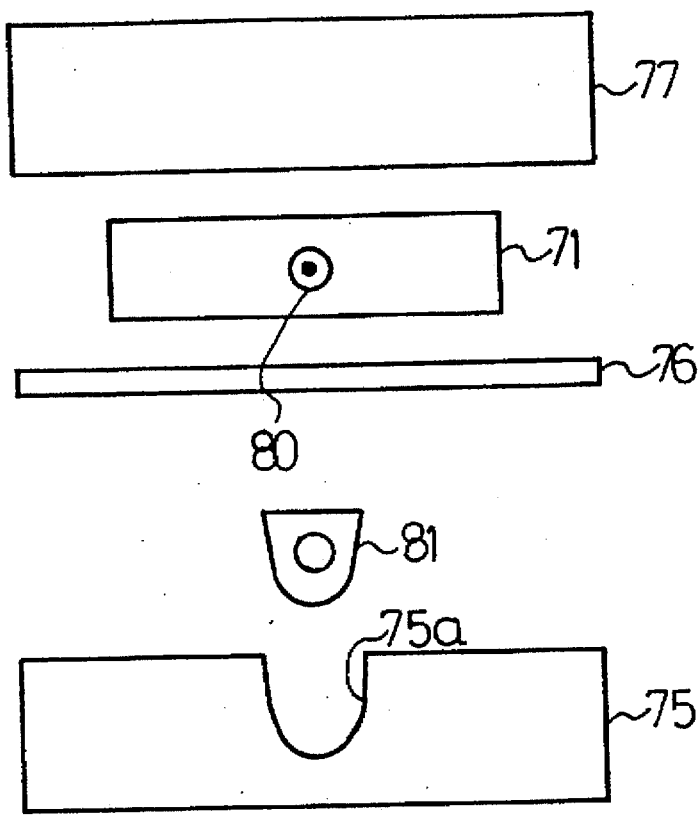
FIG. 2A is a diagram showing assembly of a top cover and a bottom cover shown in FIG. 1.
Figure 2B:
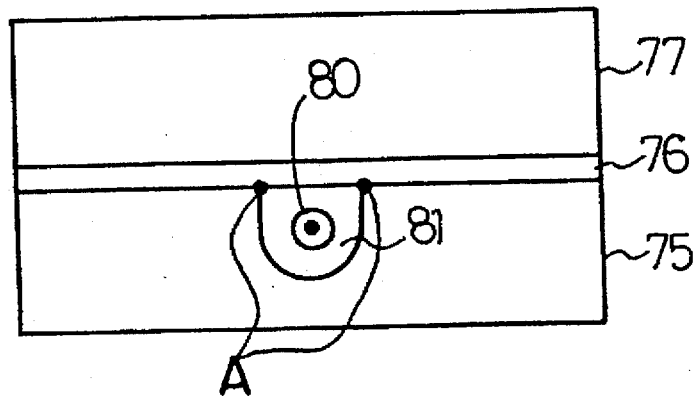
FIG. 2B is a side view showing a state in which the top cover and the bottom cover shown in FIG. 1 are assembled.

A permanent magnet (not shown) for fixing the hermetically sealed case 1 to a hood or the like of a vehicle is disposed at the bottom of the bottom case 2. An antenna unit (not shown) (electrical device) is provided on the permanent magnet. This antenna unit has the same construction as that of the conventional antenna unit shown in FIG. 1.

Figure 5:
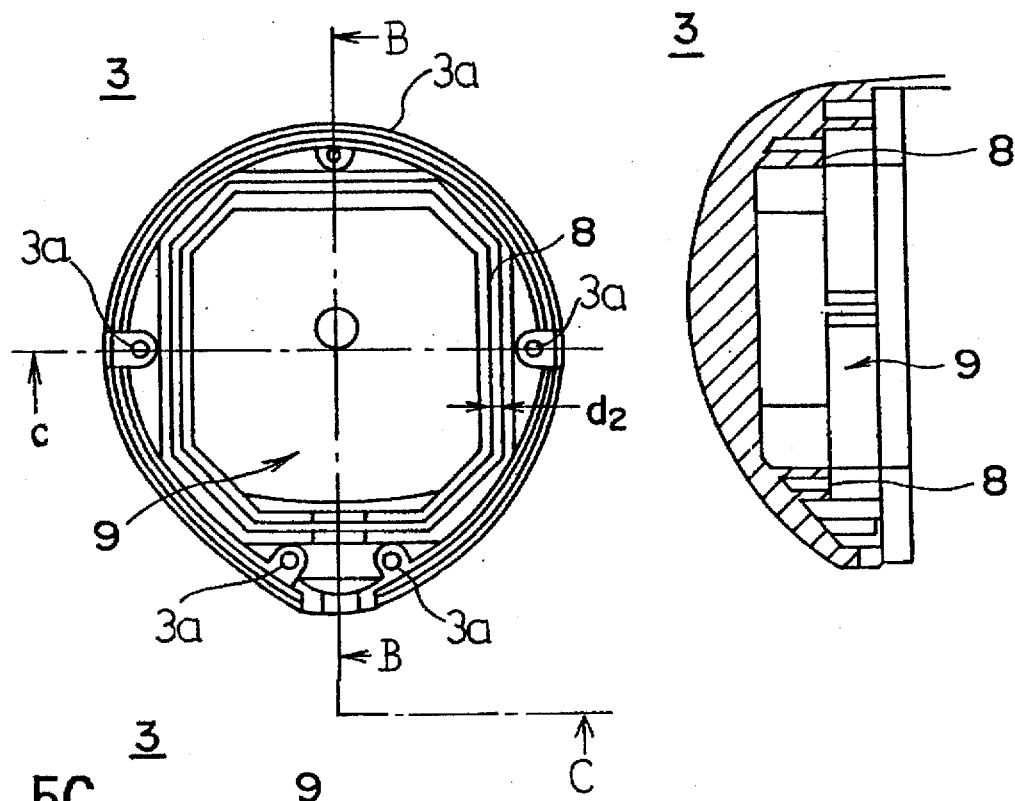
FIG. 5A is a bottom view of a bottom case shown in FIG. 3.
FIG. 5B is a cross sectional view taken along the line B—B of FIG. 5A.
FIG. 5C is a fragmentary cross sectional view taken along the line C—C of FIG. 5A.

FIG. 5A is a bottom view of the top case 3, FIG. 5B is a cross sectional view taken along the line B—B of FIG. 5A, and FIG. 5C is fragmentary cross sectional view taken along the line C—C of FIG. 5A.

The top case 3 is formed of a resin, and a groove 8 is formed inside the top case 3. Viewed from top, the groove 8 has the shape of an octagonal annular body which corresponds to the shape of the projection 25 described above. Given that the width of the groove 8 is $d_2$ (see FIG. 5A), $d_2 > d_1$. A cavity communicating with the accommodating space 9 for accommodating the antenna unit (not shown) is formed inside the top case 3.

Screw holes 3a are formed at positions corresponding to the positions of the holes 2a (see FIG. 4A) of the bottom case 2. The screw holes 3a are holes for screwing the bottom case 2 to the top case 3.

Figure 6:
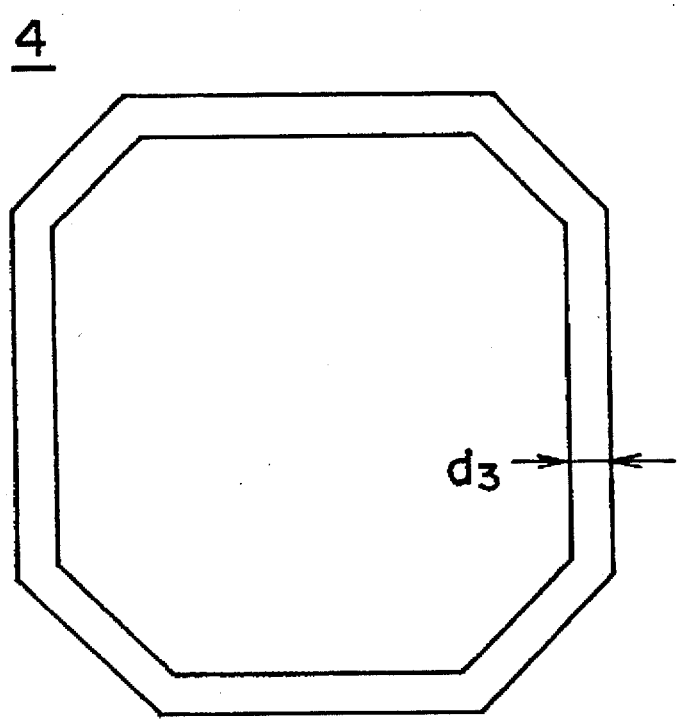
FIG. 6 is a top view of a waterproof packing shown in FIG. 3.

FIG. 6 is a top view of the waterproof packing 4. The waterproof packing 4 is formed of an elastic material such as rubber having a uniform thickness. As shown in FIG. 6, the waterproof packing 4 has the shape of a flat octagonal annular body. The waterproof packing 4 has the shape corresponding to that of the projection 25 and the groove 8 described above. Given that the width of the waterproof packing 4 is $d_3$, $d_3 > d_2$.

The top case 3 is screwed to the bottom case 2 by the screws (not shown) in the state in which the waterproof packing 4 is aligned with the projection 25 (see FIG. 4A) of the bottom case 2 and mounted thereon.

Figure 7:
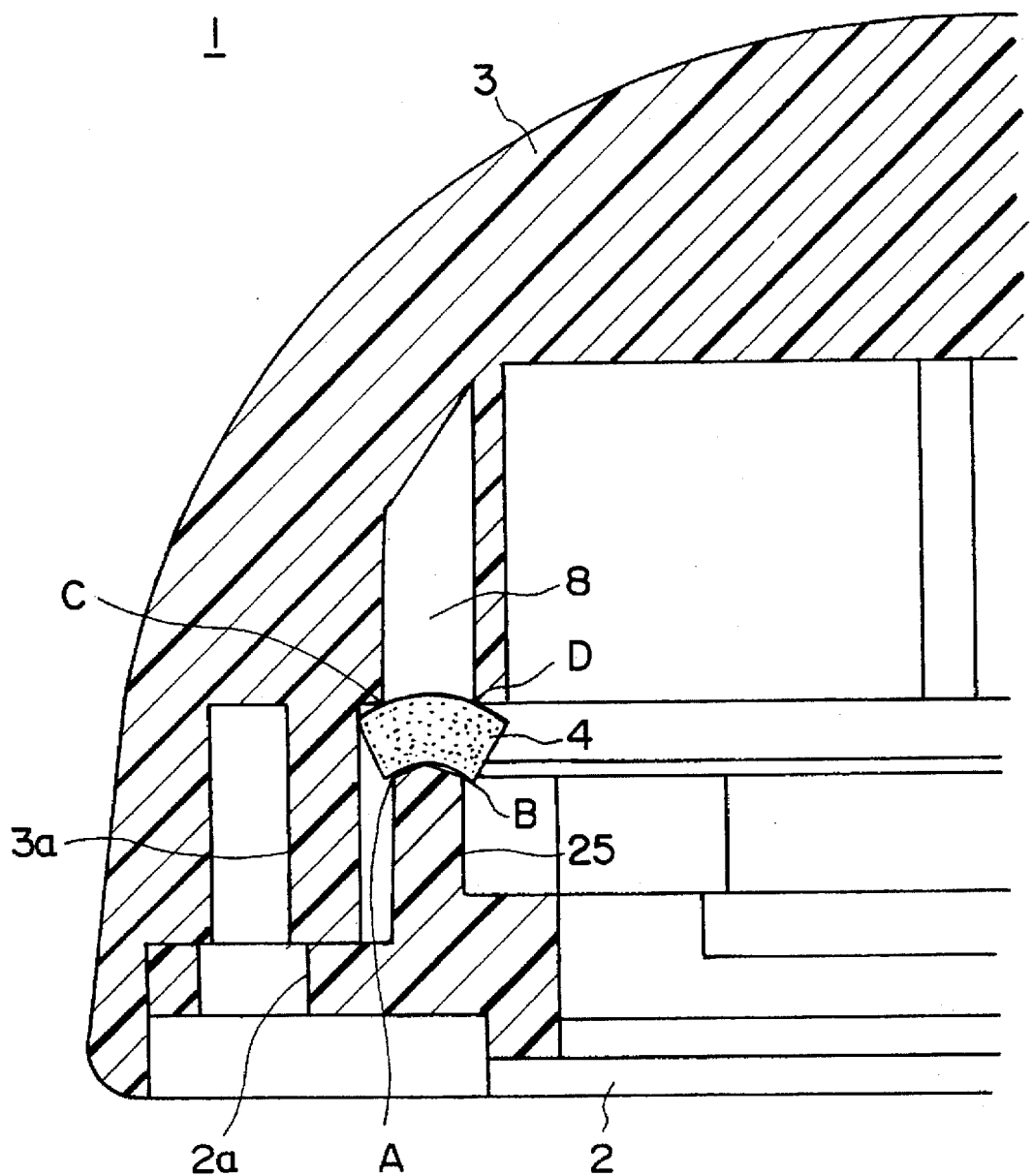
FIG. 7 is a cross sectional view of an essential part of an assembly composed of the top case, the bottom case and a waterproof packing shown in FIG. 3.

FIG. 7 is a cross sectional view of an essential part of an assembly composed of the top case 3 an the bottom case 2.

As shown in FIG. 7, the waterproof packing 4 deflects because it is sandwiched between the groove 8 and the projection 25. The waterproof packing 4 comes into line contact with the projection 25 along the ridge lines indicated by A and B, and comes into line contact with the groove 8 along the edges indicated by C and D. Therefore, even if the waterproof packing 4 is not satisfactorily flat, line contact can be maintained.

As has been described, according to the above described construction of the top case 3 and the bottom case 2, the case 1 can be completely sealed to prevent water from entering the space accommodating the antenna unit, and thus to make the antenna unit trouble free.

Figure 8:
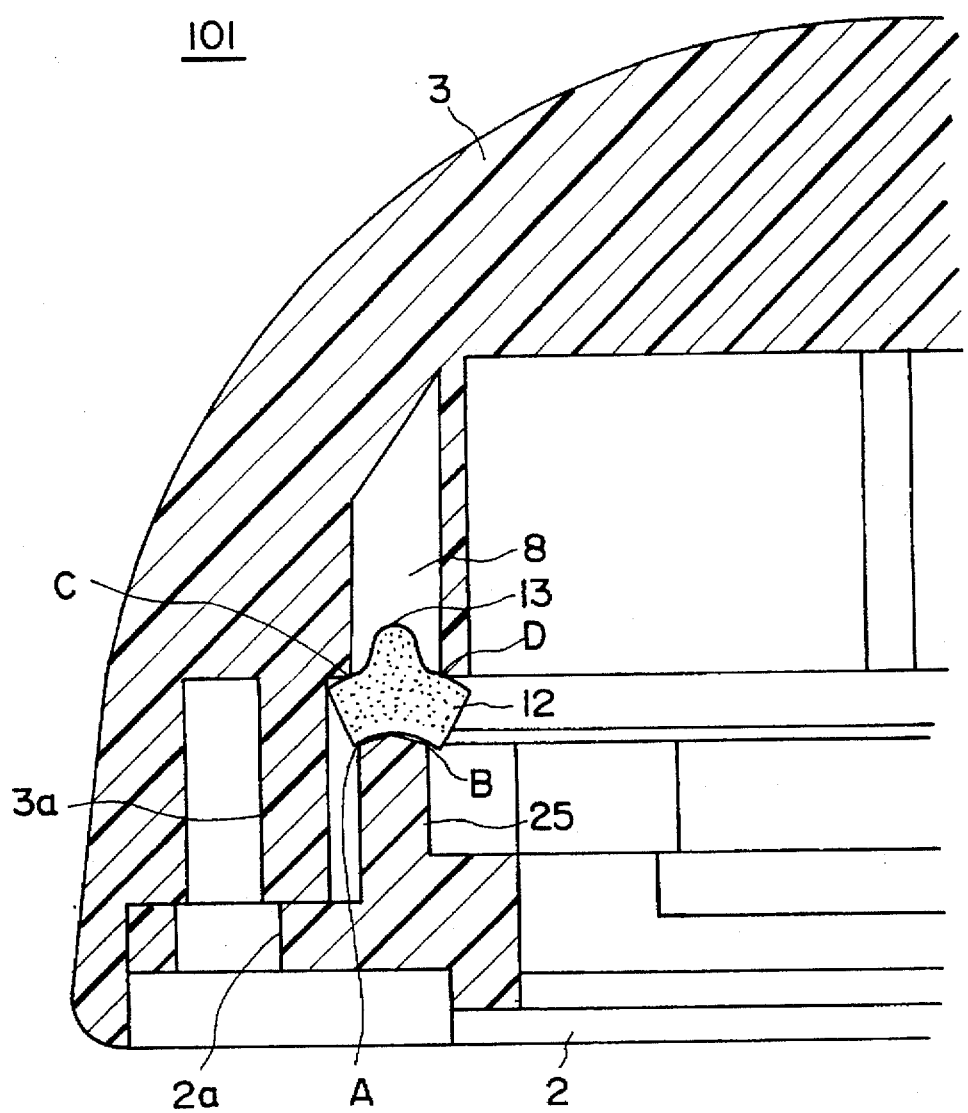
FIG. 8 is a cross sectional view of an essential part of an assembly composed of the top case and the bottom case shown in FIG. 3, and of a variation of the waterproof packing.

FIG. 8 is a cross sectional view of an essential part of the hermetically sealed case to which a variation of the waterproof packing 4 described above is applied. In FIG. 8, those parts that are identical to the parts of FIG. 7 are designated by the same reference numerals, and the description thereof will be omitted.

A hermetically sealed case 101 shown in FIG. 8 is substantially the same as the case 1 shown in FIG. 3, only difference being that the shape of a waterproof packing 12 is different from that of the waterproof packing 4 described above.

The waterproof packing 12 is formed of an elastic material such as rubber. Viewed from top, the waterproof packing 12 has the shape of an octagonal annular body. The octagonal shape of the waterproof packing 12 corresponds to the shape of the projection 25 and the groove 8.

Figure 9:
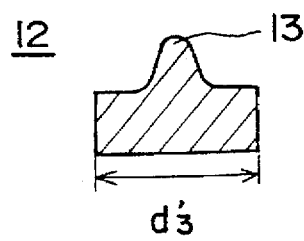
FIG. 9 is a cross sectional view of the waterproof packing shown in FIG. 8.

As shown in FIG. 9, the waterproof packing 12 has a width of $d_3'$ such that $d_3'>d_2$. A packing projection 13 which comes into contact with the inner wall of the groove 8 is formed on the top of the waterproof packing 12. The packing projection 13 also has the shape of an octagonal annular body.

The waterproof packing 12 deflects as shown in FIG. 8 by a pressure from above and below caused by screws that secure the top case 3 and the bottom case 2 to each other, with the result that the waterproof packing 12 comes into contact with the projection 25 along the ridge lines indicated by A and B, and with the groove 8 along the lines indicated by C and D. Accordingly, line contact established between the waterproof packing 12 and the projection 25, and between the waterproof packing 12 and the groove 8 is maintained even if the top and bottom of the waterproof packing 12 is not satisfactorily flat.

Since the packing projection part 13 comes into contact with the inner wall of the groove 8, the case 101 can be sealed more satisfactorily than with the waterproof packing 4. In this way, water is prevented from entering the space accommodating the antenna unit, and the antenna unit is maintained trouble free.

In the embodiments described above, it is conceivable that the width of the groove 8 is decreased. In this case, the entrance of the groove 8 is chamfered so that the entrance has the width of $d_2$.

It is not necessary that the projection 25, the groove 8 and the waterproof packings 4, 12 have the shape of an octagonal annular body. Further, the electrical device accommodated in the case is not limited to an antenna unit. Any device requiring water tightness may be accommodated.

A description will now be given of sealing of a part of the hermetically sealed case of the present invention, through which part a cable goes out.

As shown in FIG. 4A, 4B and 4C, the through hole 6 provided the projection 25 has a diameter equal to or greater than the diameter of the connecting cable 7. A supporting part 34 for supporting a cable packing 14 and a packing keep plate 15 is formed behind the through hole 6 in the interior of the case 1. The connecting cable 7 is led through the through hole 6 and goes out of the case 1.

Figure 10:
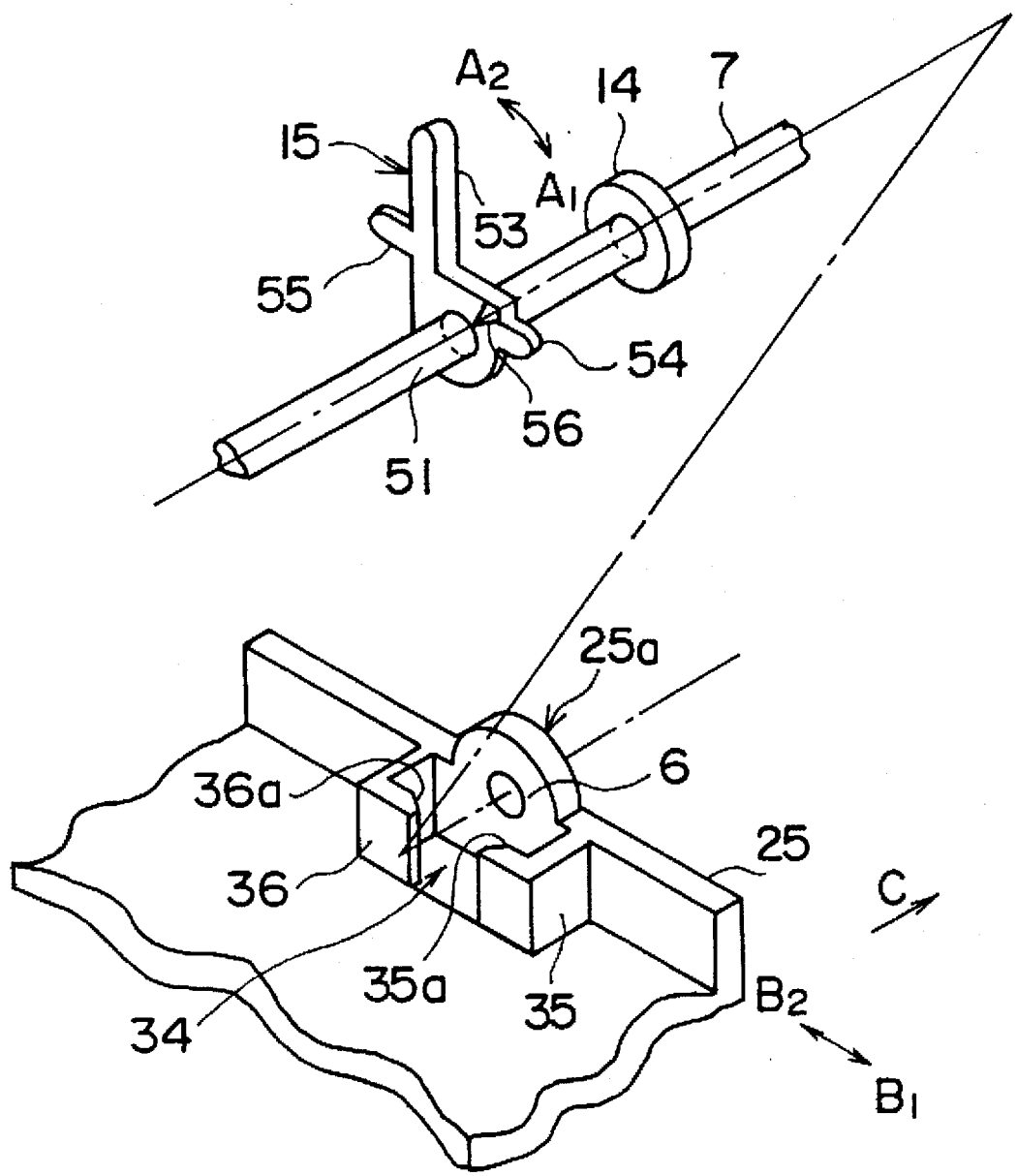
FIG. 10 is an exploded perspective view showing how a connecting cable is mounted.

FIG. 10 is an exploded perspective view showing how a space around a cable mounted in the hermetically sealed case of the present invention is sealed. The connecting cable 7 is led through a keep plate hole 51 of the packing keep plate 15 and through a packing hole 41 of the cable packing 14. The connecting cable 7 is then led outside via the through hole 6 of the projection 25.

Figure 13:
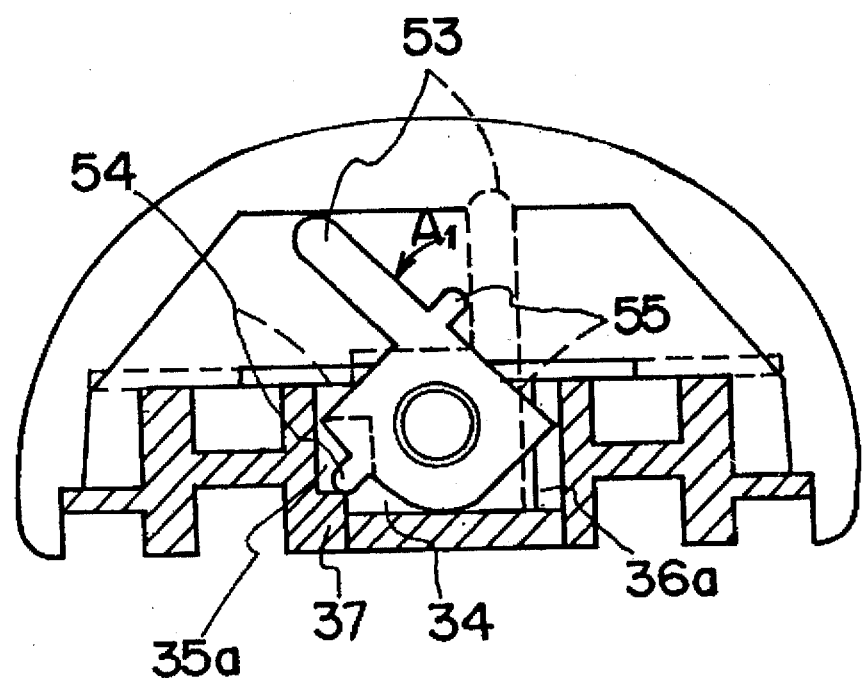
FIG. 13 is a diagram explaining the rotation of the packing keep plate.

The supporting part 34 comprises tongues 35 and 36 for applying pressure to the cable packing 14 in cooperation with the packing keep plate 15, and a projection 37 (see FIG. 13) for restraining the rotation of the packing keep plate 15. The tongues 35 and 36 are disposed on both sides of the connecting cable 7. The ends of the tongues 35 and 36, which ends face the connecting cable 7, are provided with tapered parts 35a and 36a, respectively. As a result, the tongues are wider apart from each other as they approach the projection 25.

The supporting part projection 37 is provided to project from the bottom of the supporting part 34 adjacent the tongue 35. The supporting part projection 37 restrains the rotation of the packing keep plate 15 in cooperation with the packing keep plate 15.

Figure 11:
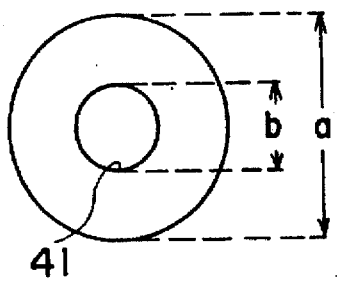
FIG. 11 is a top view of a packing for the connecting cable shown in FIG. 10.

FIG. 11 is a top view of the cable packing 14. The cable packing 14 is produced by forming an elastic material such as rubber into a ring. The cable packing 14 has a uniform, predetermined thickness. The diameter a of the cable packing 14 is greater than that of the through hole 6 of the bottom case 2 and is formed with the packing hole 41 at the center. The inner diameter b of the packing hole 41 is smaller than the outer diameter of the connecting cable 7.

The cable 7 is led through the packing hole 41, and the cable packing 14 encloses the connecting cable 7. The cable packing 14 is disposed in the supporting part 34 together with the connecting cable 7.

Figures 12A, 12B:
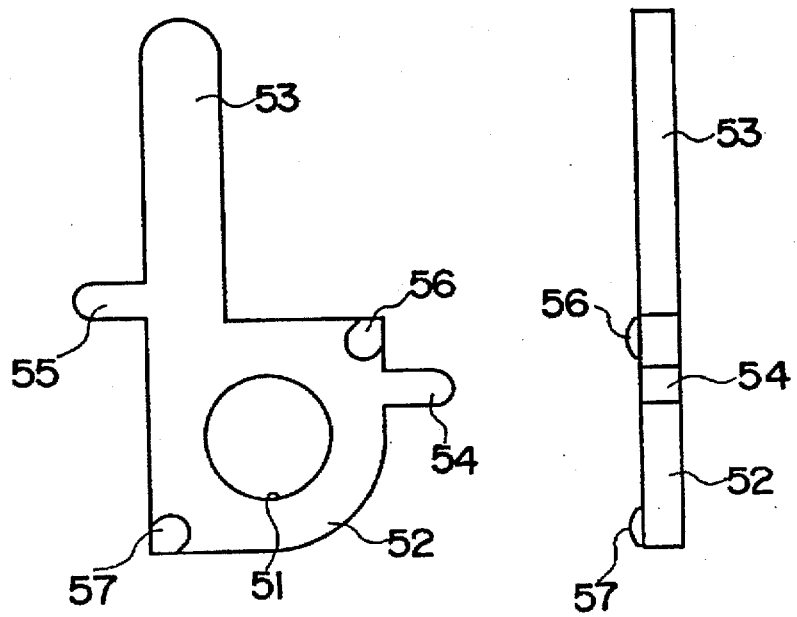
FIG. 12A is a top view of a packing keep plate shown in FIG. 10.
FIG. 12B is a side view of the packing keep plate.

FIG. 12A is a top view of the packing keep plate 15, and FIG. 12B is a side view thereof. For example, the packing keep plate 15 is produced by press forming of a stainless plate (SUS302). The packing keep plate 15 comprises a keep part 52, a lever part 53, a stopper part 54 and a positioning projection part 55. The keep part 52 is formed with the keep plate hole 51 through which the connecting cable 7 is led. The lever part 53 is provided so as to rotate the keep part 52. The rotation of the packing keep plate 15 is restrained by the stopper part 54 engaging with the supporting part projection 37 formed in the supporting part 34. The positioning projection part 55 properly positions the packing keep plate 15 when the packing keep plate 15 is mounted in the supporting part 34.

On one surface of the packing keep plate 15, projections 56 and 57 are formed around the keep plate hole 51.

The connecting cable 7 is led through the keep plate hole 51 so that packing keep plate 15 is held rotatable around the connecting cable 7. The keep plate projections 56 and 57 of the packing keep plate 15 face the accommodating space 9. The cable packing 14 is provided adjacent the surface of the packing keep plate 15, which surface is not provided with the keep plate projections 56 and 57. In this state, an assembly composed of the packing keep plate 15, the cable packing 14 and the connecting cable 7 is mounted in the supporting part 34.

The positioning projection 55 of the packing keep plate 15 then engages with the top of the tongue 36. In this state, the lever part 53 is perpendicular to the bottom of the bottom case 2, and the keep plate projections 56 and 57 engage with the tapered parts 35a and 36a of the tongues 35 and 36, respectively. As will be described below, when the packing keep plate 15 is rotated in a direction indicated by the arrow A1 shown in FIG. 13, the keep plate projections 56 and 57 move along the tapered parts 35a and 36a of the tongues 35 and 36, respectively, so that the packing keep plate 15 moves toward the cable packing 14.

Figure 14A:
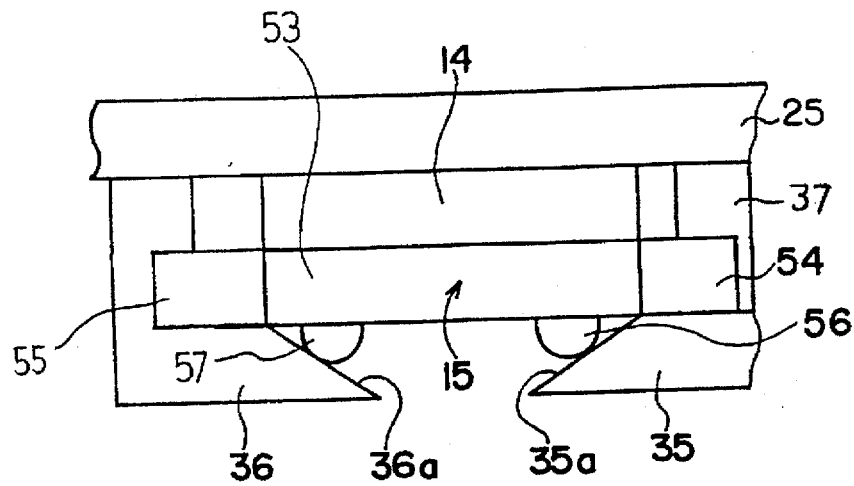
FIGS. 14A, 14B and 14C are diagrams explaining the function of the packing keep plate.
Figure 14B:
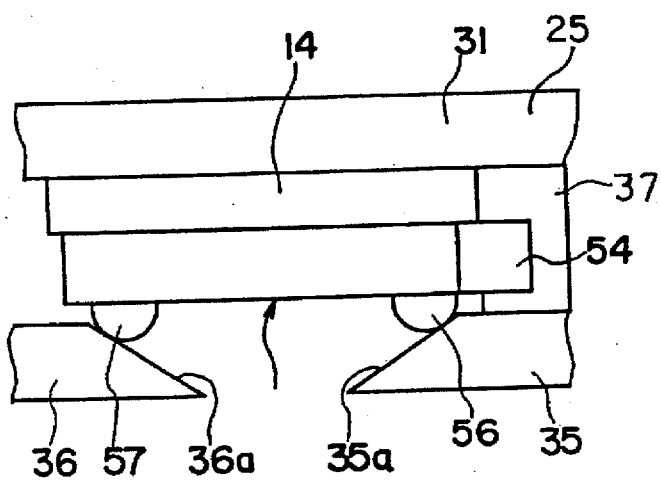
Figure 14C:
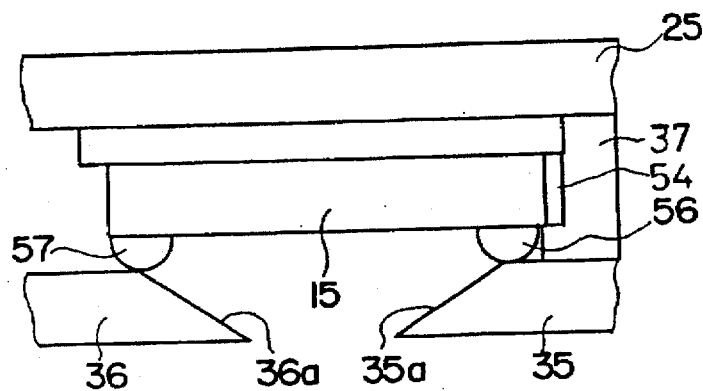

FIGS. 14A, 14B and 14C are diagrams explaining sealing of an area around the cable according to the construction described above. As shown in FIG. 14A, the cable packing 14 and the packing keep plate 15 are held in the supporting part 34. When the lever part 53 is operated so as to rotate the packing keep plate 15 in the direction indicated by the arrow A1 shown in FIG. 13, the keep plate projections 56 and 57 of the packing keep plate 15 move along the tapered parts 35a and 36a, respectively, as shown in FIG. 14B. Viewed from top, this movement gives an appearance that the keep plate projections 56 and 57 become wider apart as the keep plate projections 56 and 57 slide along the tapered parts 35a and 36a, respectively. In this movement, the projections 56 and 57 approach the arch part 25a. When the packing keep plate 15 is rotated by a predetermined angle, the stopper part 54 engages with the supporting part projection 37. Consequently, further rotation of the packing keep plate 15 is prevented so that the packing keep plate 15 is held an a predetermined angle with respect to the bottom of the case.

As has been described, the packing keep plate 15 moves toward the projection 25 when rotated, so as to give pressure to the cable packing 14. As a result, the cable packing 14 is compressed between the packing keep plate 15 and the projection 25 so that the gap between the connecting cable 7 and the through hole 6 is sealed.

According to the above described embodiment of the present invention, the space created between the top case 3 and the bottom case 2 is sealed by the packing 4 or the packing 12, and the water tightness around the connecting cable 7 can be secured by the cable packing 14, the sealing by the packing 4 or the packing 12 and the sealing by the cable packing 14 being independent of each other. Hence, unstable contact like three-point contact of the conventional cases can be eliminated, sealing quality can be improved, and perfect water tightness can always be maintained.

The present invention is not limited to the above described embodiments, and variations and modifications may be made without departing from the scope of the present invention.

What is claimed is:

1. A hermetically sealed case for accommodating a device requiring water tightness, said hermetically sealed case comprising:

a first case having an annular projection formed at a periphery thereof;

a second case including an annular groove and having a shape corresponding to that of the projection of the first case formed at a periphery of the second case; and an elastic member mounted between the projection of the first case and the groove of said second case, wherein a width of said projection is smaller than a width of said annular groove, and said annular projection is fitted within said annular groove in a transverse direction; and wherein a width of the elastic member is greater than the width of the annular groove.

2. The hermetically sealed case as claimed in claim 1, wherein when said first case and said second case are assembled, the top of said annular projection and an opening of said groove are set apart by a predetermined distance, and the thickness of said elastic member is greater than said predetermined distance.

3. The hermetically sealed case as claimed in claim 1, wherein said annular projection is provided on one surface of said elastic member as said annular projection projects into said annular groove.

4. The hermetically sealed case as claimed in claim 1, wherein said annular projection is tapered off to an edge so that both sides of said annular projection are angled toward the top, whereby line contact is established between said elastic member and said annular projection when said elastic member deflects toward said annular groove.

5. The hermetically sealed case as claimed in claim 1, wherein the edges of said groove are angled so that line contact is established between said elastic member and said groove when said elastic member deflects toward said groove.

6. A hermetically sealed case for accommodating a device having a connecting cable connected to an outside device, in an accommodating space formed by engaging a pair of cases with each other via an elastic member, said hermetically sealed case comprising:

a through hole formed in one of the pair of cases, through which through hole the connecting cable from the device accommodated in the accommodating space is led;

a press-fit elastic member provided adjacent to said through hole in the accommodating space, said press-fit elastic member having a hole through which said connecting cable is led, and which is press-fit between said through hole and said connecting cable so as to seal a gap between said through hole and said connecting cable; and a press-fitting means for press-fitting said elastic member in said gap between said through hole and said connecting cable; and wherein said press-fitting means comprises:

a pair of tapered walls that are provided near said through hole in the accommodating space, and are wider apart from each other as they approach said through hole; and a keep plate which has sliding parts which slide over respective tapered edges of said tapered walls and is disposed between said through hole and said tapered walls together with said elastic member, wherein said connecting cable is inserted through said through hole in a state in which said connecting cable is inserted through said press-fit elastic member and said keep plate, said elastic member being disposed between said keep plate and said through hole, and said keep plate moving toward said through hole by the sliding parts of said keep plate sliding over said respective tapered edges of said tapered walls, so that said press-fit elastic member is pressed.

7. The hermetically sealed case as claimed in claim 6, wherein said sliding parts of said keep plate are a pair of keep plate projections, the horizontal component of the distance between said pair of projections increases as said keep plate is rotated around a midpoint of said pair of projections, so that said keep plate is moved toward said through hole.

8. The hermetically sealed case as claimed in claim 7, wherein said keep plate has an extended part which, by engaging with a part of one of said pair of cases, positions said keep plate at a predetermined angle with respect to the cases.

9. The hermetically sealed case as claimed in claim 7, wherein said keep plate has a supported part projection which, by engaging with a part of one of said pair of cases, restrains the rotation of said keep plate.

10. The hermetically sealed case as claimed in claim 7, wherein said keep plate has a lever for rotating said keep plate.

* * * * *